United States Patent
Crook et al.

(10) Patent No.: US 11,251,037 B2
(45) Date of Patent: Feb. 15, 2022

(54) METHOD OF DEPOSITING SILICON NITRIDE

(71) Applicant: SPTS TECHNOLOGIES LIMITED, Newport Gwent (GB)

(72) Inventors: Kathrine Crook, Newport Gwent (GB); Steve Burgess, Newport Gwent (GB)

(73) Assignee: SPTS TECHNOLOGIES LIMITED, Newport (GB)

( * ) Notice: Subject to any disclaimer, the term of this patent is extended or adjusted under 35 U.S.C. 154(b) by 0 days.

(21) Appl. No.: 16/541,615

(22) Filed: Aug. 15, 2019

(65) Prior Publication Data

US 2020/0058498 A1 Feb. 20, 2020

(30) Foreign Application Priority Data

Aug. 17, 2018 (GB) ..................................... 1813467

(51) Int. Cl.
*H01L 21/02* (2006.01)
*C23C 16/34* (2006.01)
(Continued)

(52) U.S. Cl.
CPC ...... *H01L 21/02274* (2013.01); *C23C 16/345* (2013.01); *C23C 16/505* (2013.01);
(Continued)

(58) Field of Classification Search
None
See application file for complete search history.

(56) References Cited

U.S. PATENT DOCUMENTS

| 7,608,300 B2 | 10/2009 | Bencher |
| 2011/0183526 A1 | 7/2011 | Yamamoto et al. |
| 2013/0052365 A1 | 2/2013 | Liu |

(Continued)

FOREIGN PATENT DOCUMENTS

| CN | 1819120 A | 8/2006 |
| TW | 200629361 A | 8/2006 |

OTHER PUBLICATIONS

Kallis et al., Cost-Effective MOSFET-Transistors on Bulk Silicon in the Deep Sub-50 nm-region, 6th Int'l Multi-Conference on Systems, Signals and Devices, IEEE, 2009.

(Continued)

*Primary Examiner* — Steven B Gauthier
(74) *Attorney, Agent, or Firm* — Hodgson Russ LLP

(57) ABSTRACT

A method is for depositing silicon nitride by plasma-enhanced chemical vapour deposition (PECVD). The method includes providing a PECVD apparatus including a chamber and a substrate support disposed within the chamber, positioning a substrate on the substrate support, introducing a nitrogen gas ($N_2$) precursor into the chamber, applying a high frequency (HF) RF power and a low frequency (LF) RF power to sustain a plasma in the chamber, introducing a silane precursor into the chamber while the HF and LF RF powers are being applied so that the silane precursor forms part of the plasma being sustained, and subsequently removing the LF RF power or reducing the LF RF power by at least 90% while continuing to sustain the plasma so that silicon nitride is deposited onto the substrate by PECVD.

16 Claims, 10 Drawing Sheets

(51) Int. Cl.
  *C23C 16/505* (2006.01)
  *H01J 37/32* (2006.01)
  *C23C 16/52* (2006.01)

(52) U.S. Cl.
  CPC .......... *C23C 16/52* (2013.01); *H01J 37/3244* (2013.01); *H01J 37/32082* (2013.01); *H01J 37/32165* (2013.01); *H01L 21/0217* (2013.01); *H01L 21/02211* (2013.01); *H01J 2237/3321* (2013.01); *H01J 2237/3323* (2013.01)

(56) References Cited

U.S. PATENT DOCUMENTS

| | | | |
|---|---|---|---|
| 2013/0171834 A1* | 7/2013 | Haverkamp | C23C 16/402 438/763 |
| 2015/0013607 A1 | 1/2015 | Haverkamp et al. | |
| 2015/0093908 A1* | 4/2015 | Reddy | H01L 21/02274 438/758 |

OTHER PUBLICATIONS

Setyawan et al., "Particle formation and trapping behavior in a TEOS/O2 plasma and their effects on contamination of a Si wafer," Aerosol Science and Technology, vol. 38, No. 2, 120-127, Aug. 17, 2010.

Shimada et al., "Visualization and control of particulate contamination phenomena in a plasma enhanced CVD reactor," Annual Meeting AIChE Plasma Processing in Electronic Materials Processing session, Nov. 11, 2004.

Kashihara et al., "Suppression of particle generation in a plasma process using a sine-wave modulated rf plasma," Journal of Nanoparticle Research, vol. 8, No. 3-4, 395-403, 2006.

Li et al., "Stress Control of Silicon Nitride Films Deposited by Plasma Enhanced Chemical Vapor Deposition," Optoelectronics Letters, vol. 12, No. 4, 285-289, Jul. 2016.

EPO, European Search Report for EP19192030, Jan. 27, 2020.

* cited by examiner

METHOD OF DEPOSITING SILICON NITRIDE

BACKGROUND

This invention relates to a method of depositing silicon nitride. More specifically, this invention relates to a method of depositing silicon nitride onto a substrate by plasma-enhanced chemical vapour deposition (PECVD). This invention also relates to a plasma-enhanced chemical vapour deposition (PECVD) apparatus for depositing silicon nitride onto a substrate.

Silicon nitride films produced using low temperature plasma-enhanced chemical vapour deposition (PECVD) processes have uses in the semiconductor and microelectronics industry. For example, such silicon nitride films may be used as thin layers to control wafer stress and/or wafer bow in low temperature via reveal applications. It is essential for these silicon nitride films to exhibit excellent electrical properties whilst maintaining a low thermal budget. Known processes typically use a low temperature PECVD process with a high deposition rate (0.2-0.6 μm/min) to achieve the desired properties of the silicon nitride film.

However, the formation of unwanted silicon-rich particles has been observed during such low temperature PECVD processes. FIGS. 1A and 1B are SEM images of defects sectioned by focused ion beam (FIB) showing examples of silicon-rich particles formed on the surface of the substrate during the deposition of silicon nitride by PECVD. These particles may also bond together to form clusters of particles on the surface of the substrate (as shown in FIGS. 2 and 3). FIG. 4 shows the distribution of 3-10 μm diameter particles formed across the surface of the substrate when silicon nitride was deposited by low temperature PECVD. These particles may impact the electrical and thermal properties of the resultant film. Additionally, these particles can cause irregularities in the substrate topography, which is undesirable. It is desirable to eradicate the formation of these particles during the deposition of silicon nitride by PECVD, in particular during low temperature PECVD.

In order to control the prevalence of the silicon-rich particles, known methods involve depositing successive thin layers of silicon nitride. This allows the silicon-rich particles to be pumped away before they adhere to the substrate surface. However, this approach is time consuming and costly.

SUMMARY

The present invention in at least some of its embodiments, seeks to address some of the above described problems, desires and needs. The present invention, in at least some of its embodiments, provides a method for substantially eradicating the formation of unwanted silicon-rich particles formed during the deposition of silicon nitride by PECVD.

According to a first aspect of the invention there is provided a method of depositing silicon nitride by plasma-enhanced chemical vapour deposition (PECVD), the method comprising the steps of:

providing a PECVD apparatus comprising a chamber and a substrate support disposed within the chamber;

positioning a substrate on the substrate support;

introducing a nitrogen gas ($N_2$) precursor into the chamber;

applying a high frequency (HF) RF power and a low frequency (LF) RF power to sustain a plasma in the chamber;

introducing a silane precursor into the chamber while the HF and LF RF powers are being applied so that the silane precursor forms part of the plasma being sustained; and subsequently removing the LF RF power or reducing the LF RF power by at least 90% while continuing to sustain the plasma so that silicon nitride is deposited onto the substrate by PECVD.

Introducing the silane precursor into the chamber while both the HF and LF RF powers are being applied has been found to reduce the prevalence of unwanted silicon-rich particles formed during a PECVD process for depositing silicon nitride. Without wishing to be bound by any theory or conjecture, it is believed that the additional LF RF power (in combination with the HF RF power) helps to form a more stable plasma regime.

The HF and LF RF powers may be applied for a period immediately prior to the introduction of the silane precursor, wherein the period is sufficient to stabilise the plasma being sustained. The period may be at least 2 s, and preferably at least 3 s. Applying the LF RF power for the period of at least 2 s immediately prior to introducing the silane helps to fully stabilise the plasma and thereby eradicate the formation of unwanted silicon-rich particles.

The LF RF power may be applied for a period of less than about 15 s immediately prior to the step of introducing the silane precursor into the chamber, preferably less than about 10 s, more preferably about 5 s. Applying the LF RF power for a period of less than about 15 s, preferably about 5 s, helps to reduce processing time and increase substrate throughput.

The LF RF power may be removed or reduced by at least 90% within about 10 s from introducing the silane precursor into the chamber, preferably less than about 5 s, and more preferably less than about 2 s. Preferably, the LF RF power is removed as soon as or shortly after the silane precursor forms part of the plasma being sustained. For example, the LF RF power may be removed or reduced by at least 90% as soon as the flow rate of the silane precursor has reached the desired flow rate. The introduction of the silane precursor into the chamber may temporarily destabilise the plasma. The step of removing or reducing the LF RF power may be performed when the plasma has re-stabilised. The step of removing or reducing the LF RF power may be optimised to maximise the stability of the plasma without compromising the properties of the silicon nitride film being deposited. Preferably, the LF RF power is reduced by at least 95%, more preferably by at least 99%, and most preferably by 100% while continuing to sustain the plasma. That is, it is most preferable to fully remove the LF RF power while continuing to sustain the plasma.

The HF RF power may be applied to a gas inlet of the PECVD apparatus. The gas inlet may be a showerhead. The LF RF power may be applied to the gas inlet or a substrate support of the PECVD apparatus.

The high frequency (HF) and low frequency (LF) powers are radio frequency (RF) powers. The frequency of the HF RF power may be more than 2 MHz, and preferably about 13.56 MHz.

The frequency of the LF RF power may be 300-500 kHz, preferably 350-400 kHz, and more preferably about 360-380 kHz.

The HF RF power may have a power of 500-1200 W, for example, when processing a 300 mm diameter substrate. The HF RF power applied is correlated to the silicon nitride deposition rate. Preferably, the silicon nitride deposition rate is about 0.2-0.6 μm/min. A HF RF power of 500-1200 W may be suitable to achieve this preferred deposition rate. A HF RF power that exceeds 1200 W may initiate unwanted gas-phase side reactions, which may form undesirable microscopic particulate deposits.

The low frequency (LF) RF power may have a power of 100-300 W during the step of applying a high frequency (HF) RF power and a low frequency (LF) RF power to sustain a plasma in the chamber. A LF RF power in this range may be beneficial to fully eradicate the formation of silicon-rich particles without compromising the quality of the silicon nitride film being deposited.

The silane precursor may be $SiH_4$. Alternatively, the silane precursor may be a higher silane having the general formula $Si_nH_{2n+2}$, where n=2-5. From a practical point of view, it is preferable to use $SiH_4$.

The method may further comprise the step of introducing $H_2$ into the chamber. $H_2$ may be introduced into the chamber at any suitable time. For example, the $H_2$ may be introduced into the chamber at the same time as the nitrogen gas ($N_2$) precursor or the silane precursor.

The method may be performed at a temperature of less than 250° C., preferably less than 200° C. The method may be performed at a temperature of more than 80° C.

The method may further comprise the steps of: introducing an inert gas into the chamber; and generating a plasma prior to the introduction of the nitrogen gas ($N_2$) precursor, wherein the inert gas is preferably argon or helium. The inert gas may be a carrier gas. The inert gas may be a mixture of gases. The inert gas may be introduced into the chamber at any suitable time, such as at the same time as the nitrogen gas ($N_2$). An inert gas may facilitate the generation of the plasma.

According to a second aspect of the invention there is provided a plasma-enhanced chemical vapour deposition (PECVD) apparatus for depositing silicon nitride onto a substrate comprising:
a chamber;
a substrate support disposed within the chamber;
a gas inlet system for introducing gases into the chamber;
a high frequency (HF) RF power supply configured to apply a HF RF power to the gas inlet system;
a low frequency (LF) RF power supply configured to apply a LF RF power to one of the gas inlet system or the substrate support;
a supply of a nitrogen gas ($N_2$) precursor to the gas inlet system;
a supply of a silane precursor to the gas inlet system; and
a controller;
wherein the controller, in use, introduces the silane precursor into the chamber while the HF and LF RF powers are being applied so that the silane precursor can form part of a plasma being sustained in the chamber, and subsequently removes the LF RF power while continuing to sustain the plasma so that silicon nitride can be deposited onto the substrate by PECVD.

Whilst the invention has been described above, it extends to any inventive combination of the features set our above, or in the following description, drawings or claims. For example, any features disclosed in relation to the first aspect of the invention may be combined with any features of the second aspect of the invention.

BRIEF DESCRIPTION OF THE DRAWINGS

Embodiments of the method in accordance with the invention will now be described with reference to the accompanying drawings, in which.

DETAILED DESCRIPTION OF EMBODIMENTS

Figure 5A:
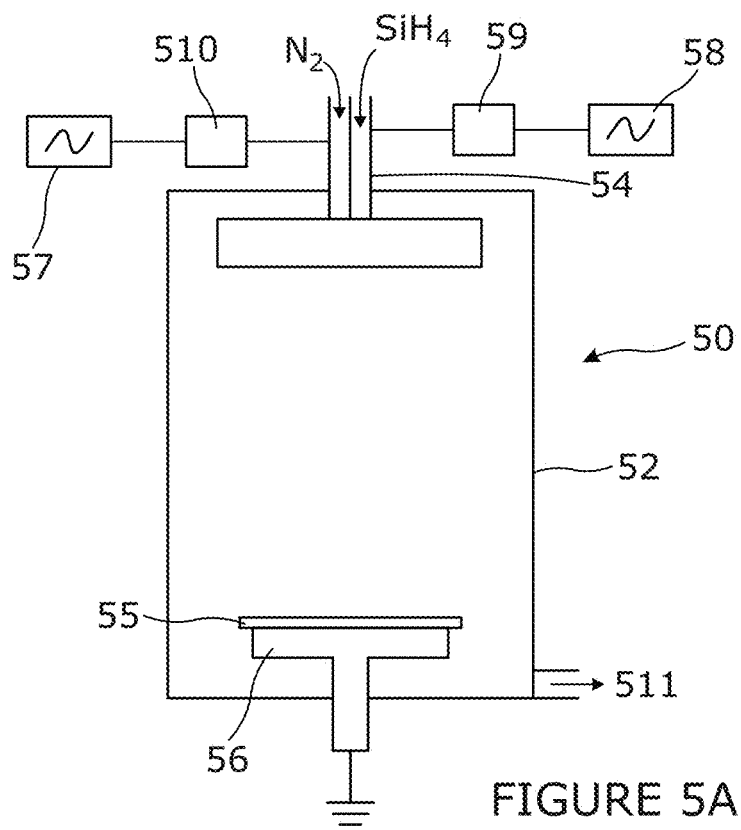
FIGS. 5A and 5B are schematic cross-sectional views of PECVD apparatus according to the present invention.

FIG. 5A shows a schematic cross-sectional view of a PECVD apparatus 50 suitable for performing the method of the invention. The apparatus 50 comprises a chamber 52, a gas inlet system in the form of a showerhead 54, and a substrate support 56 for supporting a substrate (55). The high frequency and low frequency power supplies 57 and 58 are configured to apply high frequency (HF) and low frequency (LF) RF power to the gas inlet system 54. Matching units 59 and 510 are provided for the high and low frequency RF power supplies 57 and 58 respectively. FIG. 5A shows the substrate support 56 as being electrically grounded. However, it may be convenient to supply HF and/or LF RF power to the substrate support as required. A controller (not shown) is typically used to control the introduction of process gases into the chamber 52, and to control the HF and LF powers being applied. A pumped outlet 511 is provided for removing surplus reaction gases.

Figure 5B:
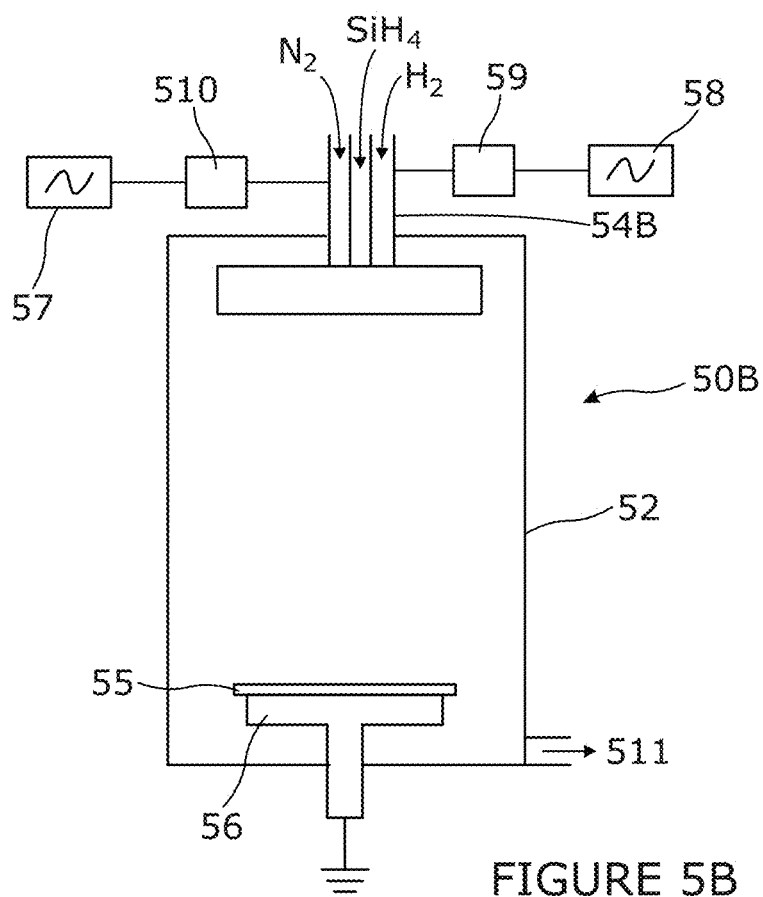
Figure 6:
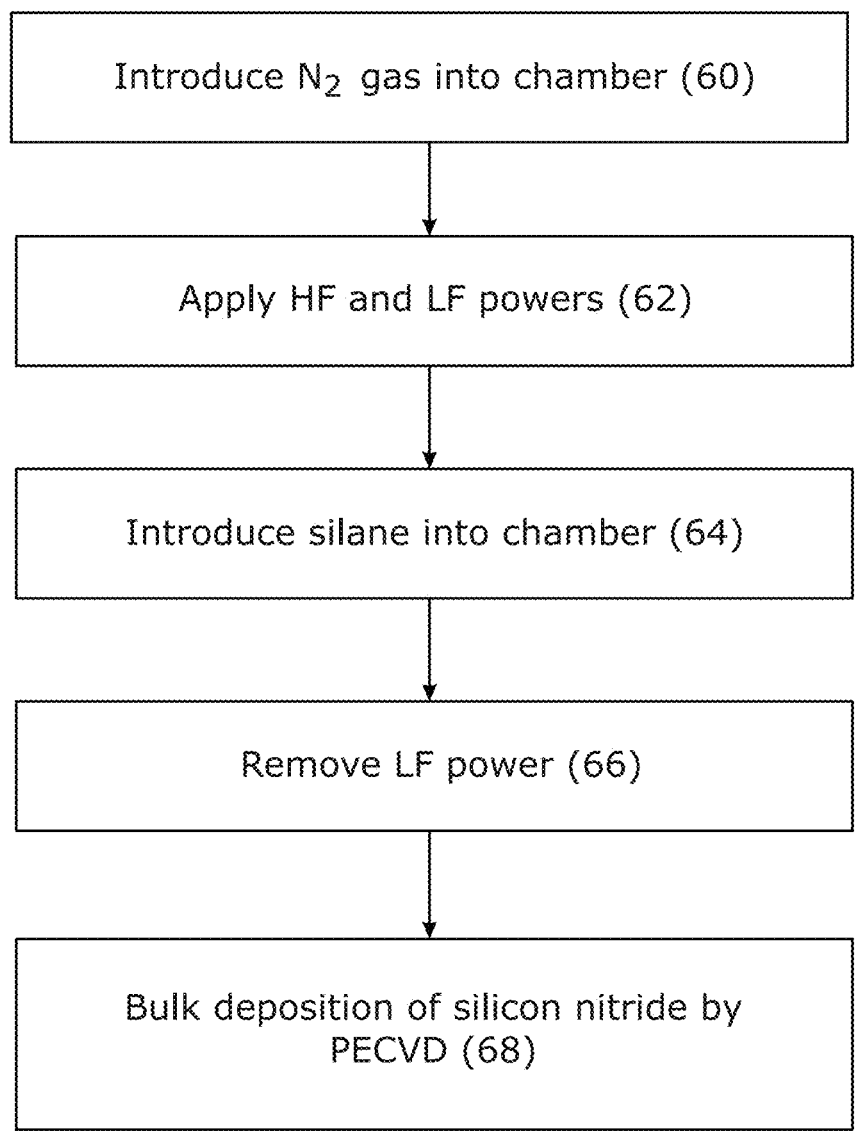
FIG. 6 is a flow chart illustrating steps in the method according to the first embodiment.

The method according to a first embodiment of the invention is illustrated in the flow chart of FIG. 6. The first embodiment of the invention is a method of depositing silicon nitride using a PECVD process, wherein the precursors for the PECVD process comprise nitrogen gas ($N_2$) and a silane, such as $SiH_4$. FIG. 5A shows an apparatus 50 suitable for introducing at least two gases (e.g. $SiH_4$ and $N_2$) into the chamber 52. Optionally, hydrogen gas ($H_2$) may additionally be used as a reaction precursor. FIG. 5B shows a schematic cross-sectional view of a PECVD apparatus 50B suitable for introducing at least three gases (e.g. $SiH_4$, $N_2$ and $H_2$) into the chamber via the gas inlet 54B. For the avoidance of doubt, the same reference numerals have been used to refer to features that are identical. Preferably, the PECVD process of the invention does not include ammonia ($NH_3$) as a precursor. However, the invention is not limited in this regard.

First, a gas is introduced into the chamber 52 and a plasma is generated. In the first embodiment, the gas is a nitrogen ($N_2$) gas precursor (step 60). However, it may be convenient to use an inert gas, such as argon or helium, to generate the plasma. The inert gas may conveniently be used as a carrier gas. The $N_2$ gas precursor is a reactive starting material in the PECVD process of the present invention. Typically, the gas pressure is allowed to stabilise prior to generating the plasma.

In the first embodiment the plasma is generated by applying a mixed high frequency (HF) power and a low frequency (LF) RF power simultaneously (step 62). However, the plasma may be generated using any known method, such as by applying a HF RF power only, or by applying a LF RF power only. The present invention is not limited to the order in which the HF and LF powers are applied. The HF power is typically applied to the gas inlet, such as a showerhead 54. The HF RF power typically has a frequency of above 2 MHz, and preferably about 13.56 MHz. The HF RF power typically has a magnitude of 500-1200 W. The LF power is typically applied to the gas inlet, such as a showerhead 54, or to the substrate support. The LF RF power typically has a frequency of 300-500 kHz, preferably 350-400 kHz, and more preferably about 360-380 kHz. The LF RF power typically has a magnitude of 100-300 W. The HF and LF powers are typically RF powers.

Figure 7A:
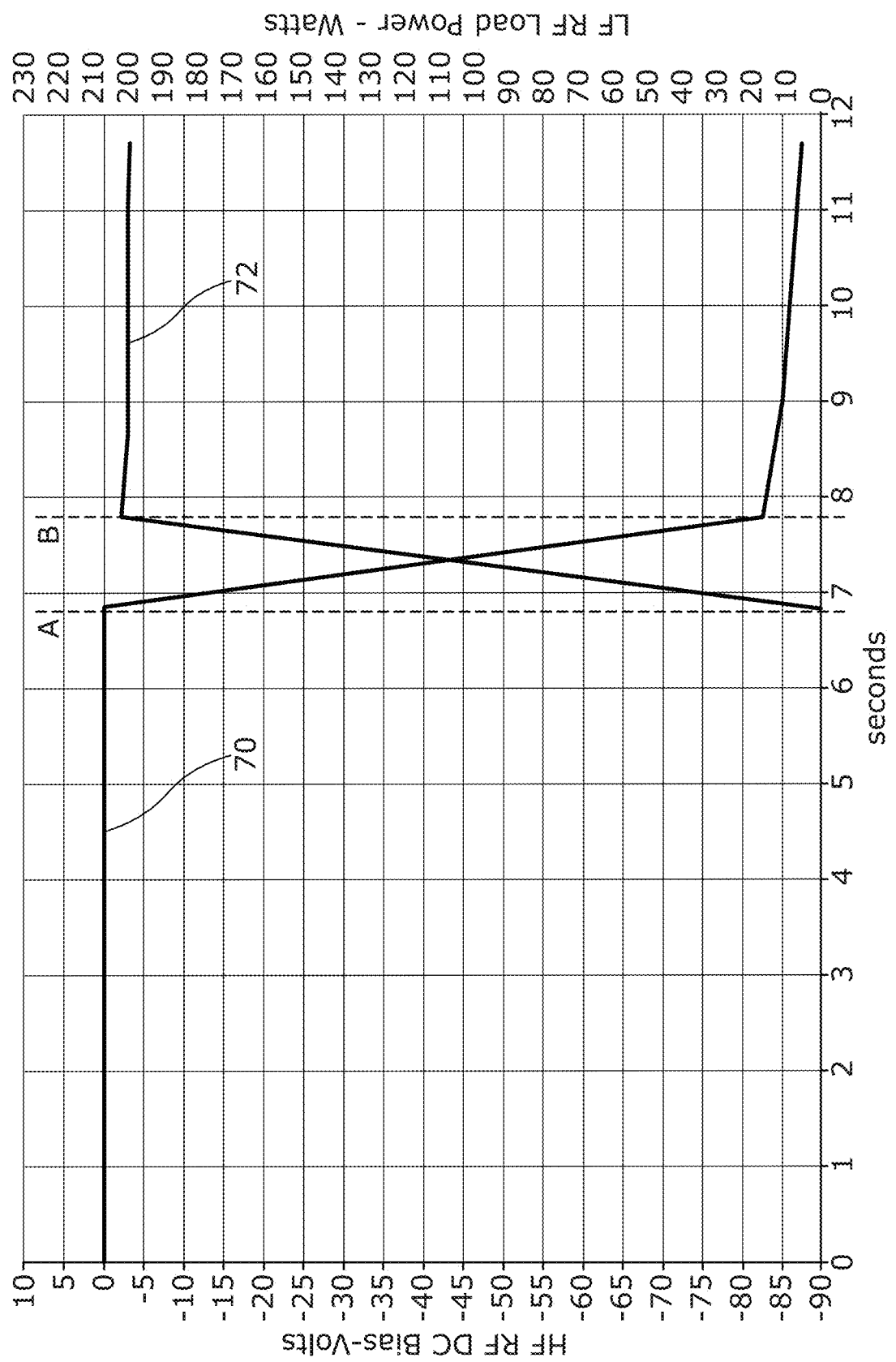
FIGS. 7A and 7B are graphs showing the stabilisation of DC bias on a showerhead against time when using mixed HF and LF power to generate and sustain a nitrogen ($N_2$) plasma.

When a plasma is generated, the DC bias on the showerhead 54 can provide information on the nature of the plasma. A substantially stable DC bias on the showerhead 54 is indicative of a stable plasma being sustained. A varying DC bias on the showerhead 54 is indicative of the plasma either not being fully stabilised after the initial plasma generation, or the plasma being destabilised. FIGS. 7A and B show how the DC bias on the showerhead (line 70) varies when generating a nitrogen gas ($N_2$) plasma using a mixed HF and LF RF power. Line 72 corresponds to the LF RF power applied (in Watts). For the avoidance of doubt, the same reference numerals have been used to refer to features that are identical.

With reference to FIG. 7A, the HF and LF RF powers are applied simultaneously at a time indicated by dashed line A, which causes a plasma to be generated/ignited. As the plasma ignites, the DC bias on the showerhead shifts to a more negative bias (between dashed lines A and B). As the plasma stabilises, the DC bias reaches a substantially steady state voltage. The plasma is fully stabilised at the time indicated by dashed line B. The nitrogen plasma stabilises within about 2 s of the HF and LF RF powers being applied.

Figure 7B:
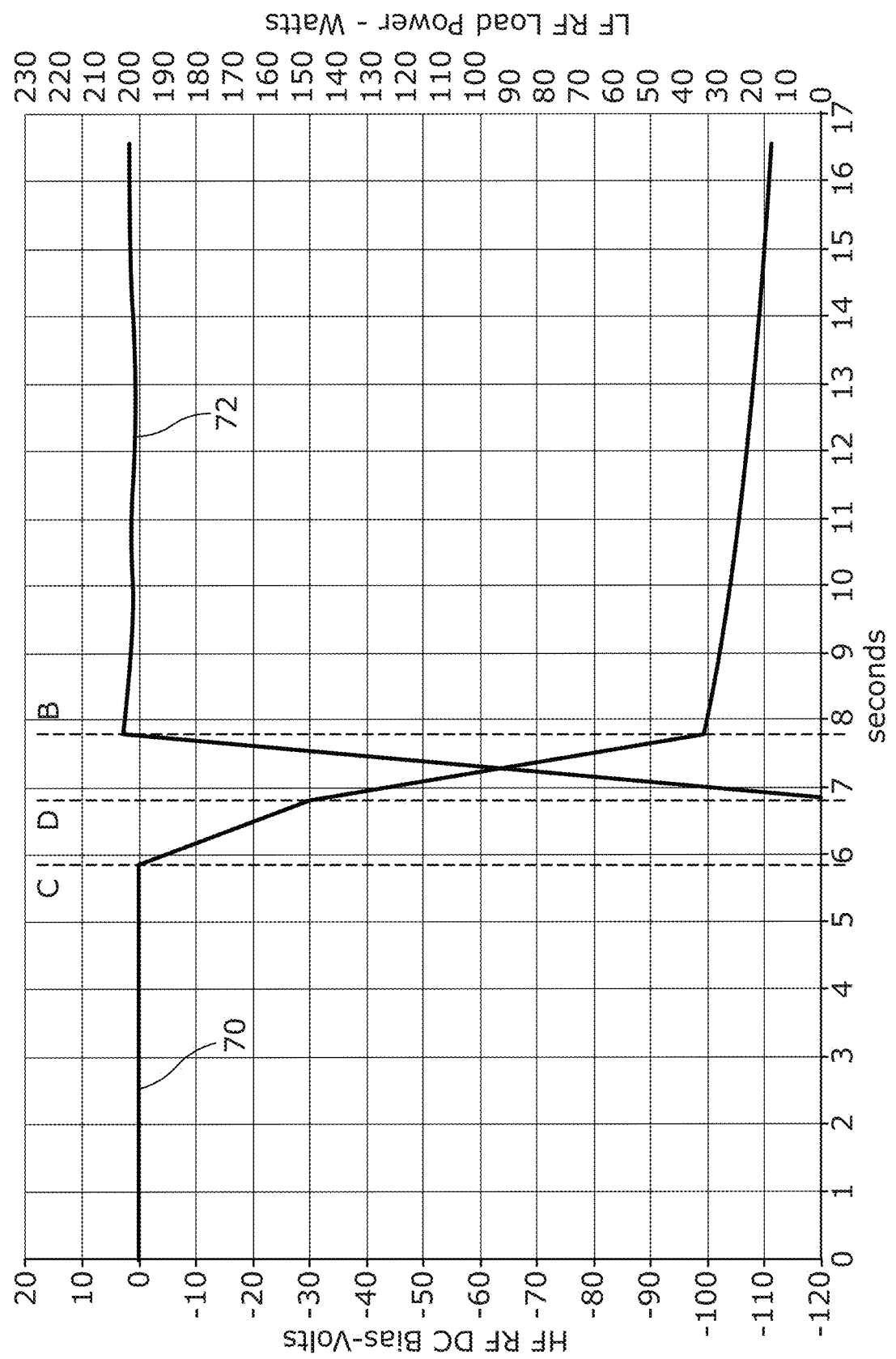

With reference to FIG. 7B, the HF RF power is initially applied at a time indicated by dashed line C, which causes a plasma to be generated/ignited. The LF RF power is initially applied at a time indicated by dashed line D. The HF RF power is applied before the LF RF power. As the plasma ignites, the DC bias on the showerhead shifts to a more negative bias, until it reaches a substantially steady state voltage. The plasma is fully stabilised at the time indicated by dashed line B. The nitrogen ($N_2$) plasma stabilises within about 2 s of the HF RF power being applied.

When the plasma has stabilised, a silane precursor is introduced into the chamber 52 (step 64). In embodiments where hydrogen gas ($H_2$) is also used as a precursor, the hydrogen gas ($H_2$) may conveniently be introduced into the chamber 52 at the same time as the silane precursor. The silane precursor and the nitrogen gas ($N_2$) precursor undergo a plasma assisted reaction to form silicon nitride, which is subsequently deposited. The silane precursor is preferably silane ($SiH_4$), however, higher silanes having the formula $Si_nH_{2n+2}$ where n=2-5 may also be used. The silane precursor is introduced while the HF and LF RF powers are both still being applied. The silane precursor interacts with the plasma being sustained to form a part of the plasma.

When the flow of the silane precursor has been established (i.e. when the silane precursor has formed part of the plasma) the LF RF power is removed (step 66). Preferably, the LF power is removed immediately after the flow of the silane precursor has reached a desired flow rate. Despite removing the LF RF power, the plasma is continued to be sustained by continuing to apply the HF RF power, and by continuing to flow the nitrogen gas ($N_2$) and silane precursors into the chamber 52. The bulk deposition of silicon nitride by PECVD (step 68) occurs after the LF RF power has been removed. Typically, the bulk deposition step 68 occurs at about 80-200° C.

The magnitude of the HF power applied during the bulk deposition step 68 is correlated to the deposition rate of silicon nitride. For low temperature PECVD of silicon nitride it is preferable to use a high deposition rate, for example about 0.2-0.6 μm/min. This can typically be achieved using a HF power with a magnitude of 500-1200 W. A power of less than about 500 W typically does not achieve an adequate deposition rate. A power of more than about 1200 W typically causes the deposited film to have a hazy (rather than specular) appearance. Without wishing to be bound by any theory or conjecture, it is believed that a power of above about 1200 W causes gas phase reactions (rather than plasma assisted reactions) to occur. The gas phase reaction products form microscopic particulate deposits on the substrate, which causes the substrate to lose its specular appearance.

In the first embodiment, the LF RF power is not applied during the bulk deposition step 68. It is preferable to completely remove the LF power so that only HF power is applied during the bulk deposition step 68.

The plasma produced and sustained by applying an HF power (only), allows uniform coupling to be achieved across the full surface of the substrate, such as a glass-bonded thin silicon substrate. This allows a uniform deposition of silicon nitride to be formed during the bulk deposition step 68. In contrast, if only a LF power is used during the bulk deposition step, the LF power tends to couple through the path of least resistance. This typically results in a non-uniform deposition thickness of silicon nitride. The non-uniformity is exacerbated on a bonded substrate.

If the LF power is maintained during the bulk deposition step 68 (in addition to the HF power), the substrate is subjected to greater ion impact during the bulk deposition, which detrimentally affects the physical properties of the deposited silicon nitride film. It is preferable for the LF power to be completely removed during the bulk deposition step 68. However, it may be convenient to substantially reduce the magnitude of the LF RF power to a nominal level during the bulk deposition step 68, for example, it may be convenient to reduce the LF RF power by at least 90%, preferably by at least 95%, and more preferably by at least 99%. Typically, the reduced LF RF power has a power of less than 30 W, preferably less than 15 W, more preferably less than 3 W, and most preferably 0 W.

The present inventors have found that introducing a silane precursor into the chamber 52 while HF and LF RF powers are both being applied can surprisingly prevent silicon-rich particles being formed during the deposition of silicon nitride by PECVD.

Figure 1A:
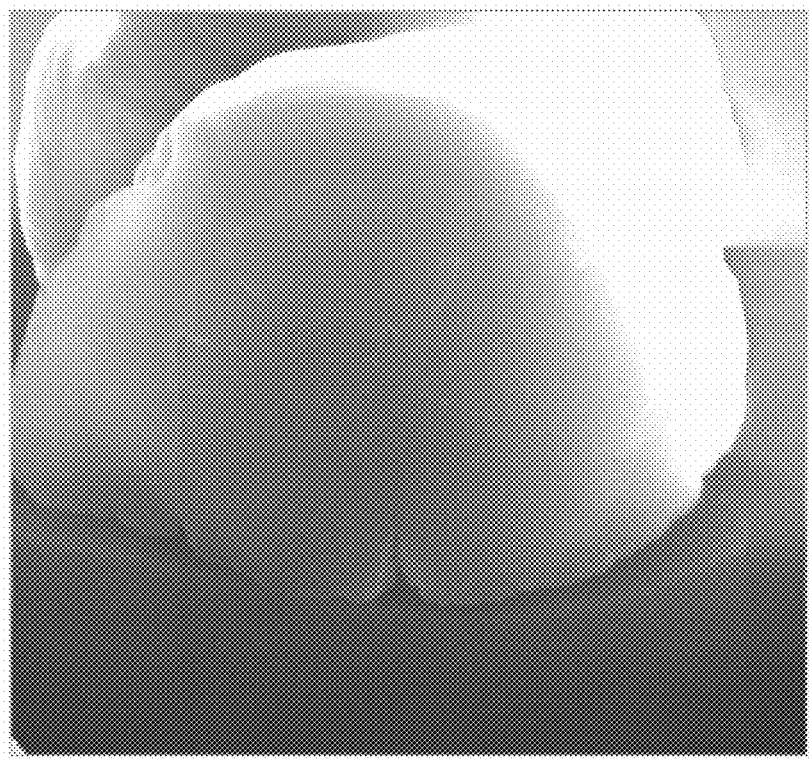
FIGS. 1A and 1B are SEM images of focused ion beam (FIB) sectioned silicon-rich particles formed on a substrate during PECVD of silicon nitride.
Figure 1B:
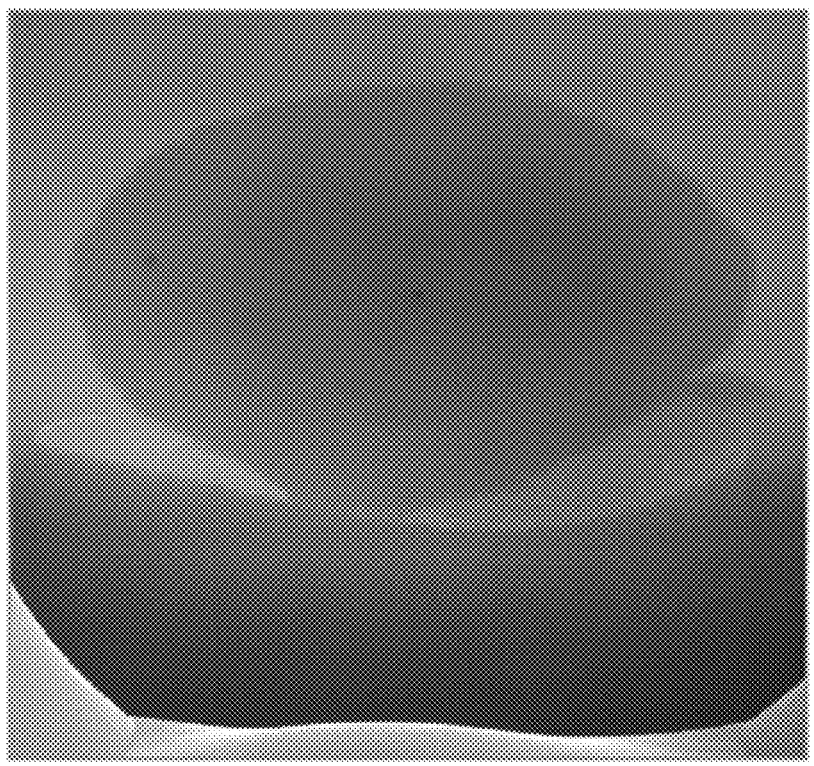
Figure 2:
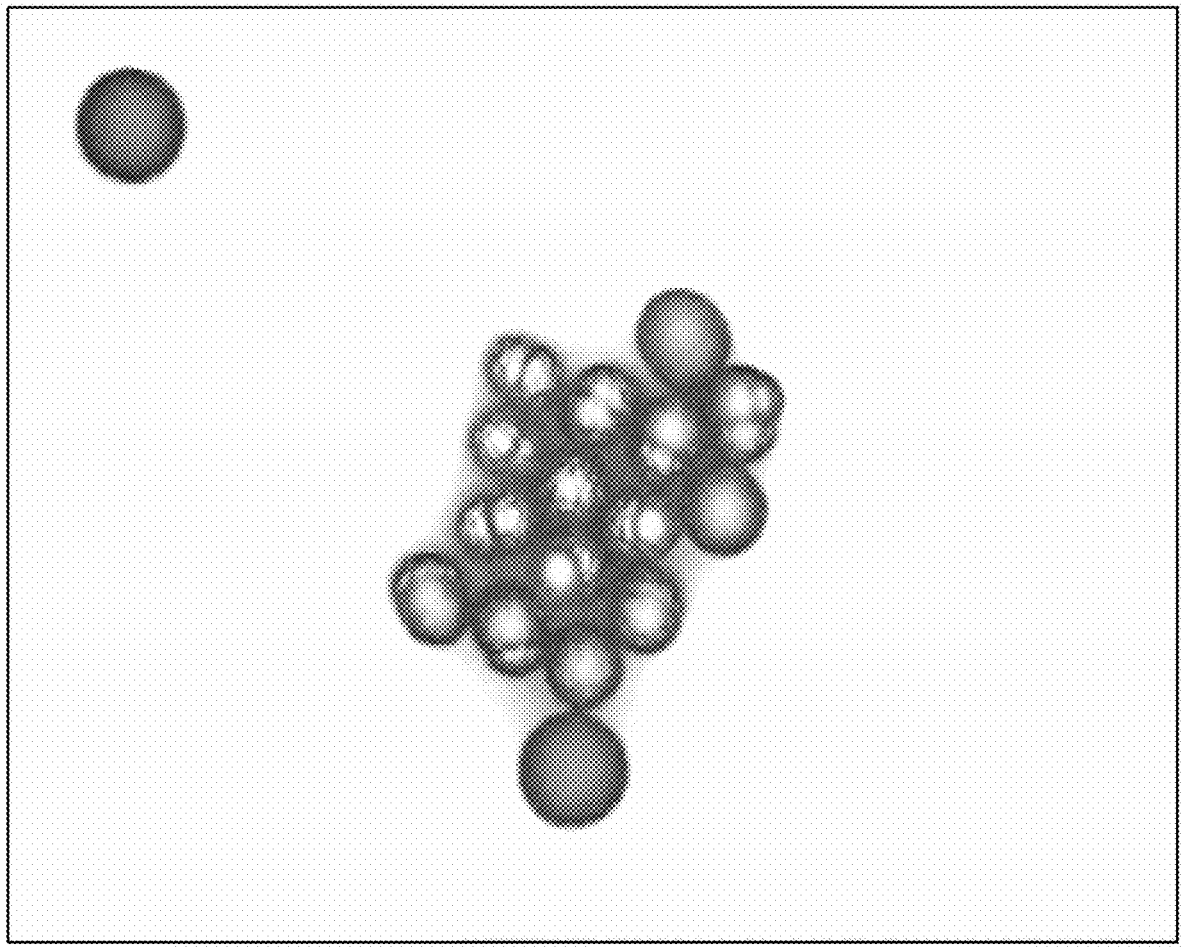
FIG. 2 is an optical microscope image showing a cluster of silicon-rich particles formed on a substrate during PECVD of silicon nitride.
Figure 3:
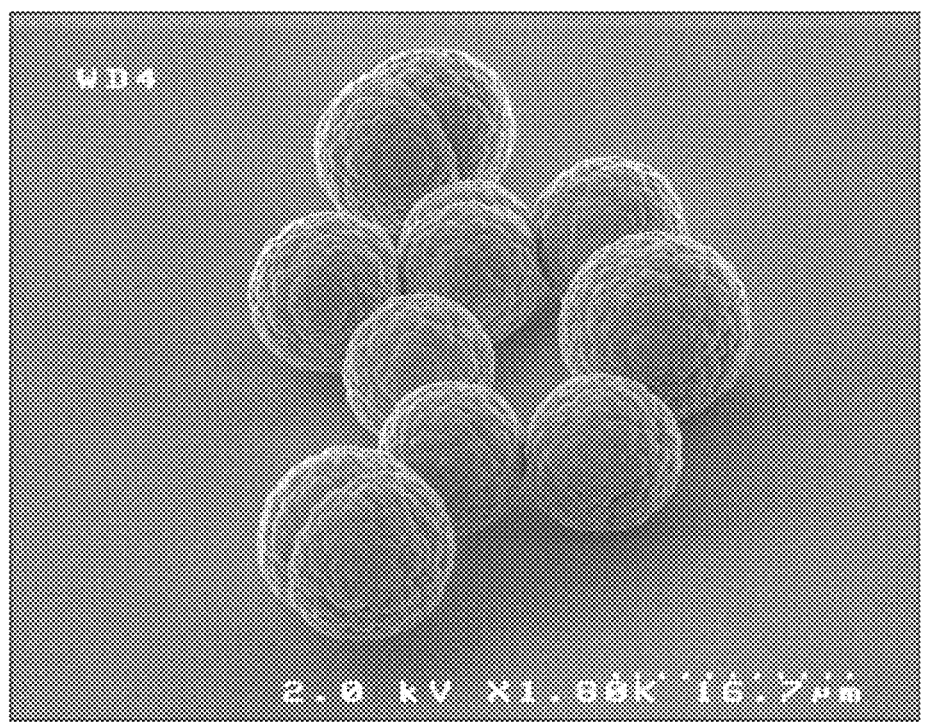
FIG. 3 is a scanning electron micrograph (SEM) of a cluster of silicon-rich particles formed on a substrate during PECVD of silicon nitride.
Figure 4:
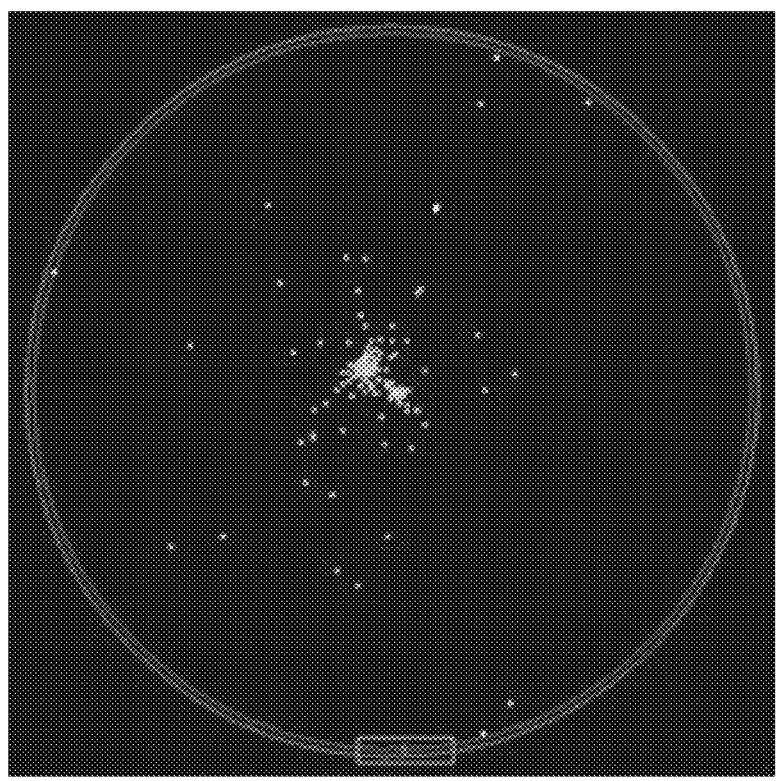
FIG. 4 is a Surfscan image showing the distribution of 3-10 μm diameter silicon-rich particles across a substrate which were formed during the PECVD of silicon nitride.
Figure 8:
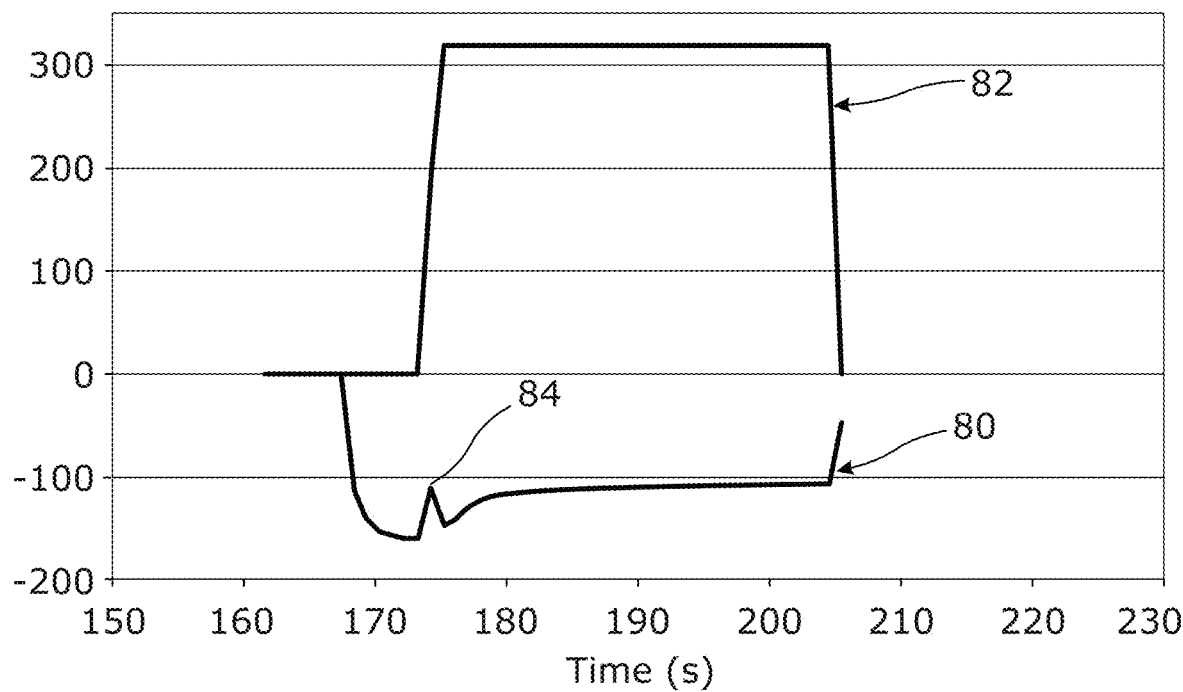
FIG. 8 is a graph showing the change in DC bias on a showerhead against time when using a HF power (only) to ignite and sustain the plasma (prior art)
Figure 9:
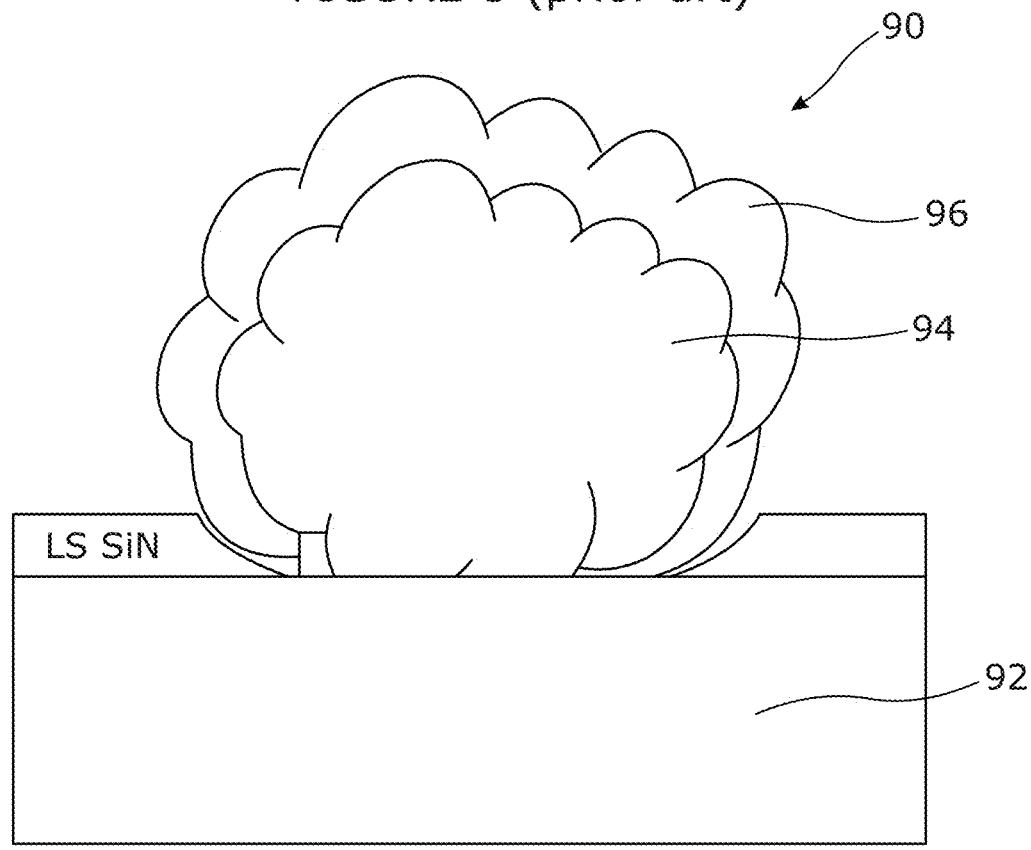
FIG. 9 is a cross-sectional illustration showing the composition of a silicon-rich particle.

In contrast, unwanted silicon-rich particles are consistently formed during known PECVD processes which only utilise a HF RF power throughout the deposition process. FIG. 8 shows how the DC bias on the showerhead (line 80) varies as a flow of silane (line 82) is introduced into the chamber according to a known PECVD process which only uses HF power. The single ordinate (y) axis principally shows the DC bias 80 (in volts). However, the y-axis is also representative of the silane flow rate 82 (in sccm). In this example, the silane precursor is introduced into the chamber after the DC bias on the showerhead has fully stabilised. Silicon-rich particles produced during a known method of depositing silicon nitride by PECVD are shown in FIGS. 1-3. The unwanted particles typically have a reproducible size, morphology, and position on the substrate. FIG. 9 is a simplified schematic cross-section of a silicon-rich particle 90 on a substrate 92. The particle 90 typically has a silicon rich core 94, with a silicon nitride coating 96. The typical diameter of the particle 90 is about 3-5 μm, and is independent of the overall deposition time. The typical thickness of the silicon nitride coating 96 is typically about 1 μm, and corresponds to the full thickness of silicon nitride deposited across the substrate.

Without wishing to be bound by any theory or conjecture, it is believed that the silicon-rich particles 90 are formed during the initial plasma generation stage of the deposition process. More specifically, it is believed that the particles form via a gas-phase reaction which initiates on the introduction of a silane into the processing chamber. If the plasma is powered by an HF power only, the HF plasma is unstable. Introduction of the silane precursor destabilises the plasma that is being sustained due to a sheath conduction property of the unstable HF plasma. This consistently results in the generation of localised unwanted silicon-rich particle clusters. The plasma destabilisation is accompanied by a change in the DC bias on the showerhead. More specifically, the formation of silicon-rich particles is accompanied by a positive (i.e. less negative) spike 84 in the DC bias on the showerhead as the silane precursor is introduced into the chamber (FIG. 8). Again without wishing to be bound by any theory or conjecture, it is believed that the positive spike 84 in DC bias results from a shape change in the plasma, which corresponds to the coupled area of the upper electrode (i.e. the showerhead) being reduced with respect to the lower electrode (i.e. the substrate support). This is accompanied by a momentary increase in the plasma density at a point location on the showerhead. Again, without wishing to be bound by any theory or conjecture, it is believed that an irregularity in the showerhead provides a nucleation site for the silicon-rich particles 90 to initially form, in particular at the point location where the plasma density is momentarily increased. The silicon-rich particles 90 are subsequently deposited onto the substrate, presumably by dropping from the showerhead onto the substrate. When the flow rate of the silane precursor has reached its desired value, the plasma re-stabilises and no further silicon-rich particles 90 are formed.

Methods of the present invention significantly reduce the prevalence of unwanted silicon-rich particles 90 formed during PECVD. Without wishing to be bound by any theory or conjecture, it is believed that the additional LF power beneficially helps to stabilise the plasma being sustained within the chamber, in particular while the reactive plasma regime is established. The addition of LF power helps to establish a more robust plasma regime which is more difficult to destabilise. Consequently, when the silane precursor is introduced into the chamber, the plasma is destabilised to a lesser extent, and the formation of silicon-rich particles 90 is eradicated.

As noted previously, it is not desirable to apply the LF power during the bulk deposition step 68. Preferably, the LF power is tuned to maximise the stability of the initial plasma (i.e. before the silane precursor is introduced at step 64) without compromising the properties of the bulk deposition. Typically, the LF power is removed as soon as or shortly after the silane precursor has become established as part of the plasma or when the desired flow rate of the silane precursor has been reached.

Typical process conditions for the deposition of silicon nitride by low temperature PECVD according to embodiments of the invention are provided in Table 1 below.

TABLE 1

| Deposition temperature (° C.) | Chamber pressure (mTorr) | N$_2$ flow rate (sccm) | SiH$_4$ flow rate (sccm) | H$_2$ flow rate (sccm) | HF RF power (W) | LF RF power (W) |
|---|---|---|---|---|---|---|
| 80-200 | 1500-3000 | 3000-7000 | 50-350 | 0-1000 | 500-1200 | 100-300 |

The distance between the upper electrode (e.g. the showerhead) and the substrate is typically about 20-25 mm.

Table 2 shows how the silicon nitride thickness and the refractive index vary with LF power (in Watts).

TABLE 2

| LF RF power (Watts) | Silicon nitride thickness (Å) | Refractive index |
|---|---|---|
| 0 | 12213 | 1.9123 |
| 200 | 12287 | 1.9134 |
| 300 | 12587 | 1.9267 |

The present inventors have found that the presence of silicon-rich particles can be detected through logged RF parameters, for example by monitoring the DC bias on the showerhead during processing. The formation of silicon-rich particles are characterised by a positive (i.e. less negative) voltage spike in the DC bias as the silane precursor is introduced into the chamber. In contrast, processes where silicon-rich particles are not formed exhibit a negative shift in the DC bias as the silane precursor is introduced.

Figure 10:
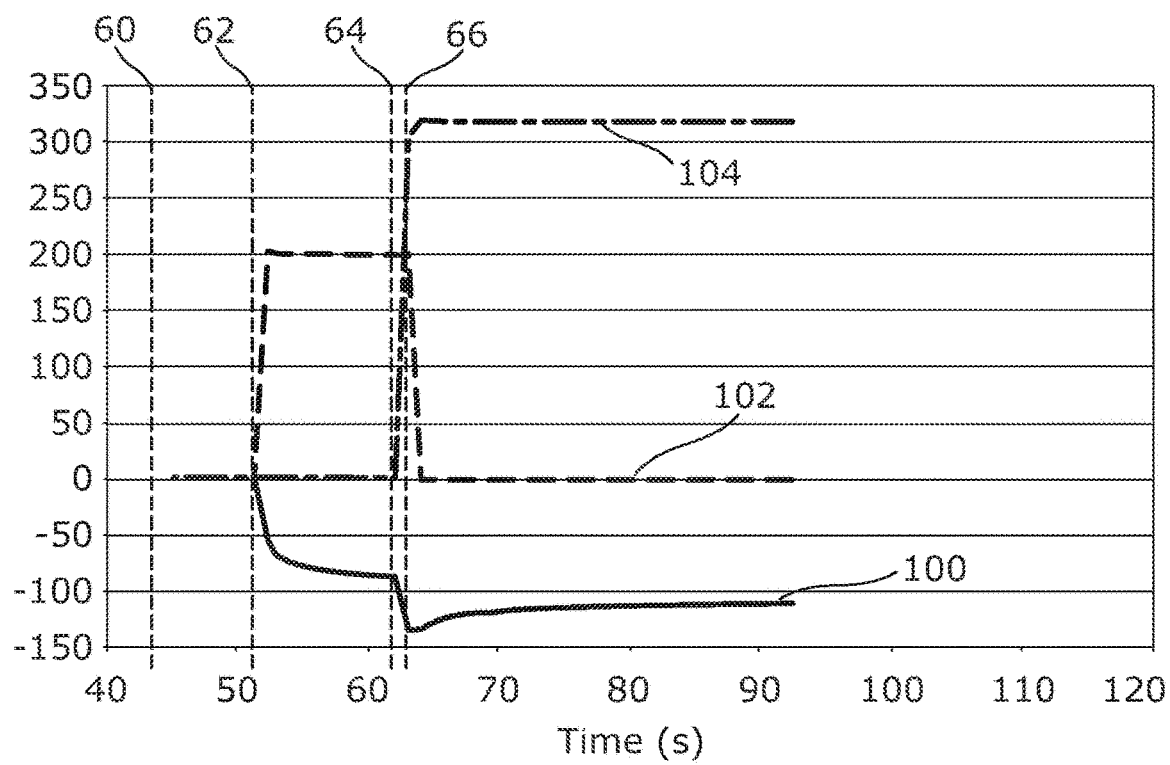
FIG. 10 is a graph showing the change in DC bias on a showerhead against time when the HF and LF powers are applied for a period of 10 s prior to the introduction of the silane precursor.

By way of example only, FIG. 10 shows how the DC bias (in volts) on the showerhead varies during a method according to an embodiment of the invention (line 100). Line 102 corresponds to the LF RF power applied (in Watts). Line 104 corresponds to the flow rate of silane precursor (in sccm). The single ordinate (y) axis principally shows the DC bias on the showerhead 100 (in volts). However, the y-axis is also representative of the LF RF power applied 102 (in Watts), and the flow rate of the silane precursor 104 (in sccm). The plasma is generated by simultaneously applying HF and LF RF powers to the showerhead. The generation of plasma is accompanied by a negative shift in the DC bias on the showerhead. The silane precursor is introduced into the chamber after the HF and LF powers have been applied for a period of 10 s. This period (also referred to as the "stabilisation period") allows the plasma that is formed to fully stabilise prior to the introduction of the silane precursor. A substantially stable DC bias is indicative of full plasma stabilisation.

The introduction of the silane precursor destabilises the plasma. However, this destabilisation is minimised by only introducing the silane precursor into the chamber after the plasma is fully established and fully stabilised through the use of both HF and LF RF powers. This helps to eradicate the formation of silicon-rich particles. Typically, no further silicon-rich particles are formed after the silane precursor has formed part of the plasma and the plasma has re-stabilised.

In this example, the introduction of the silane precursor is accompanied by a further negative shift in the DC bias on the showerhead (between dashed lines 64 and 66). The LF power is subsequently removed when flow rate of the silane has been ramped up to the desired flow rate. No silicon-rich particles were formed during this exemplary experiment.

To maximise substrate throughput, it is preferable to minimise the duration of the stabilisation period.

Figure 11:
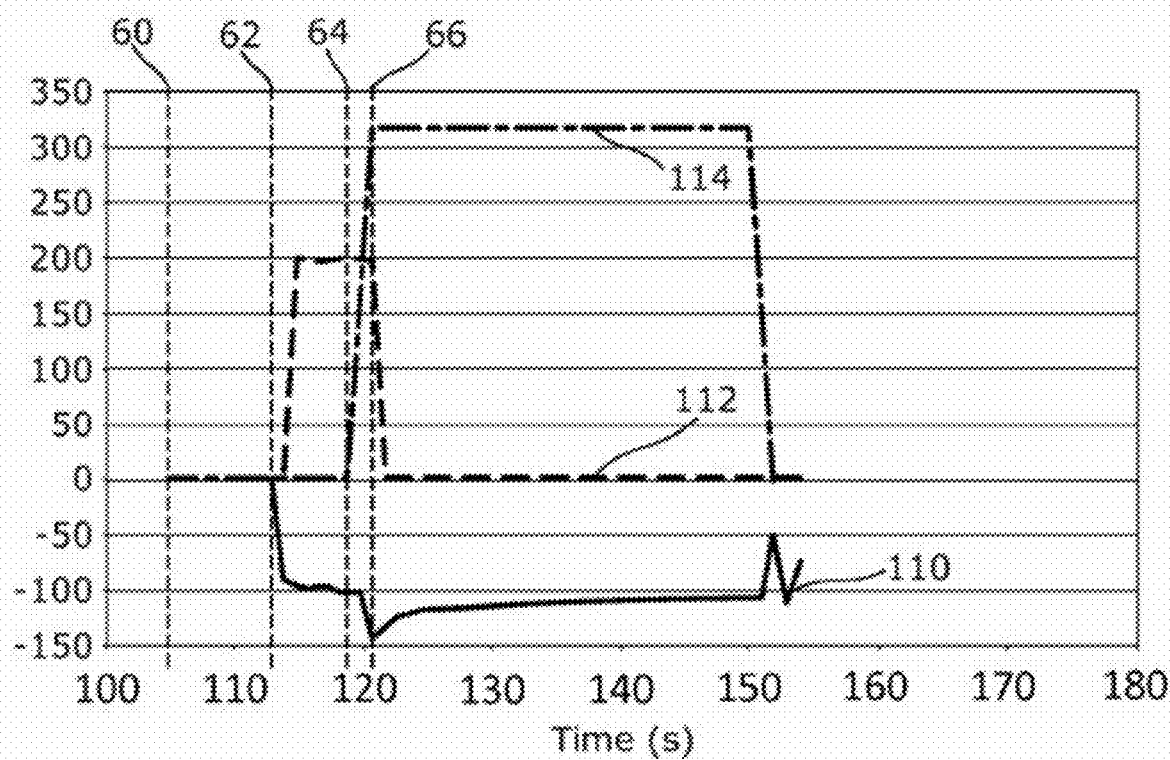
FIG. 11 is a graph showing the change in DC bias on a showerhead against time when the HF and LF powers are applied for a period of 5 s prior to the introduction of the silane precursor.

In another example, FIG. 11 shows how the DC bias (in volts) on the showerhead varies during a method according to an embodiment of the invention (line 110). Line 112 corresponds to the LF power (in Watts). Line 114 corresponds to the flow rate of the silane precursor (in sccm). The single ordinate (y) axis principally shows the DC bias on the showerhead 110 (in volts). However, the y-axis is also representative of the LF power applied 112 (in Watts), and the flow rate of the silane precursor 114 (in sccm). The method used is similar to that used for FIG. 10, except that the silane precursor is introduced into the chamber after the HF and LF RF powers have been applied (i.e. the plasma has been allowed to stabilise) for a period of 5 s. The introduction of the silane precursor is accompanied by a negative shift in the DC bias, which is indicative of no silicon-rich particles being formed during this exemplary experiment.

Figure 12:
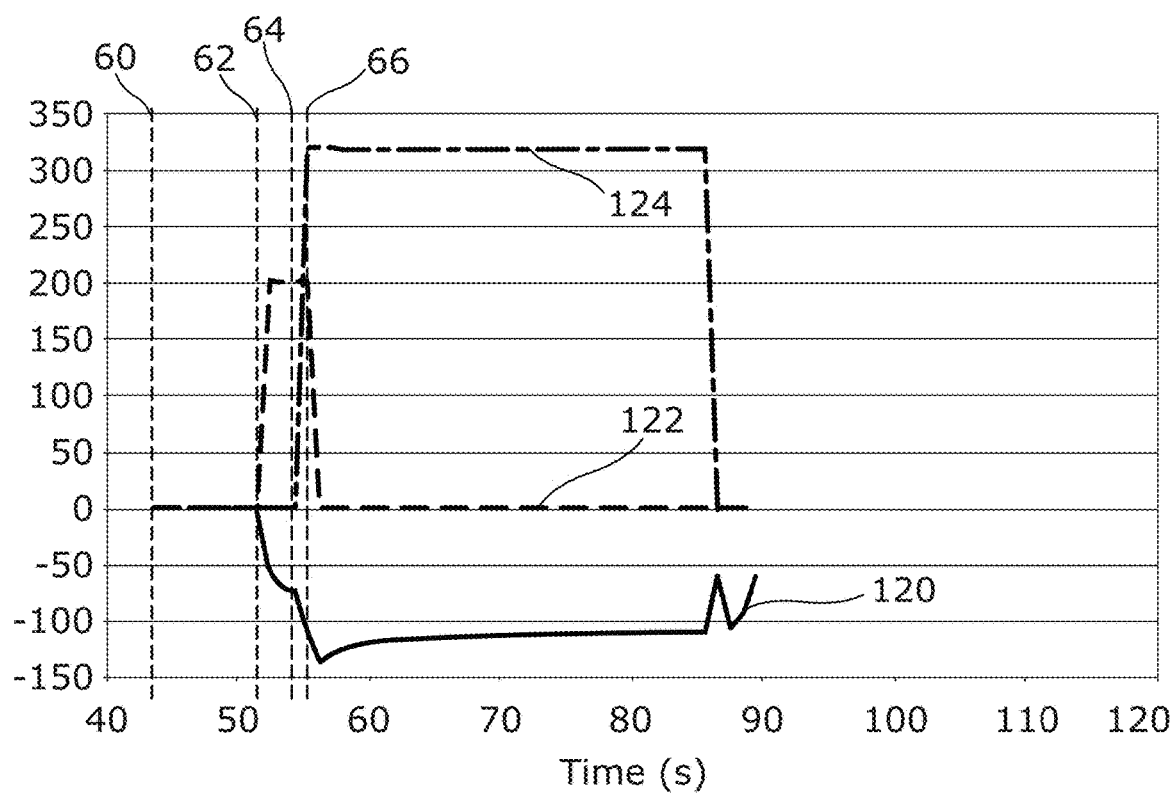
FIG. 12 is a graph showing the change in DC bias on a showerhead against time when the HF and LF powers are applied for a period of 2 s prior to the introduction of the silane precursor.
Figure 13:
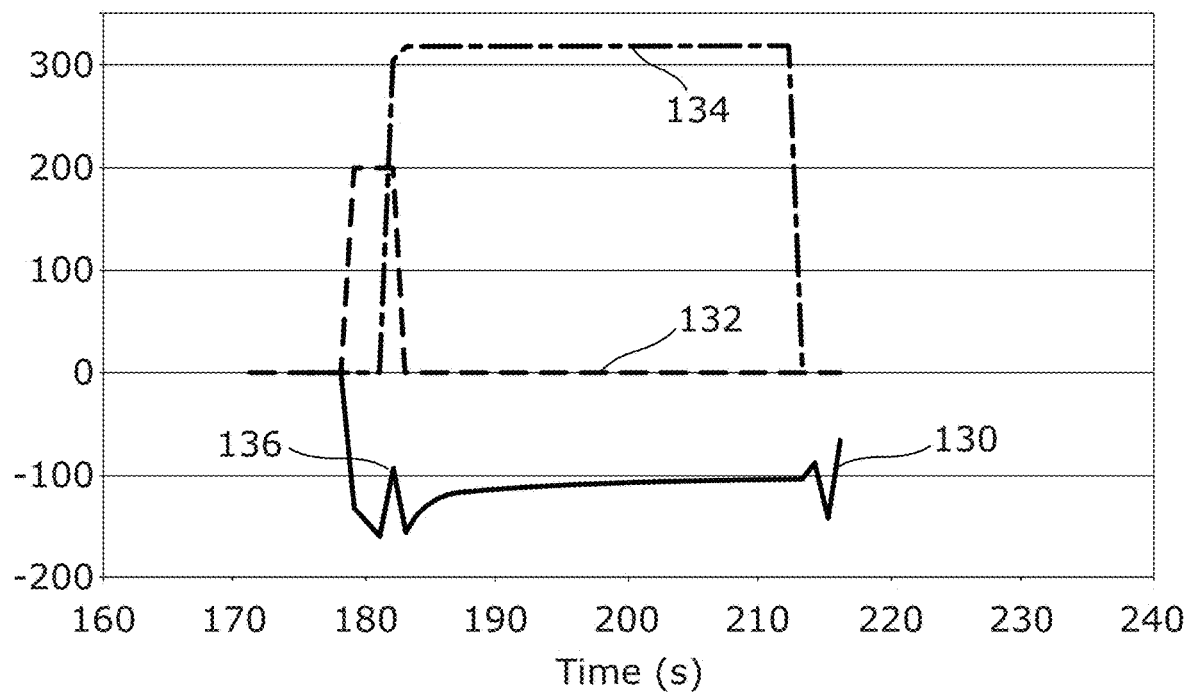
FIG. 13 is a graph showing the change in DC bias on a showerhead against time when the HF and LF powers are applied for a period of 2 s prior to the introduction of the silane precursor.

In a further example, FIGS. 12 and 13 show how the DC bias (in volts) on the showerhead varies during a method according to an embodiment of the invention (lines 120 and 130). Lines 122 and 132 correspond to the LF power (in Watts). Lines 124 and 134 correspond to the flow rate of the silane precursor (in sccm). The single ordinate (y) axis principally shows the DC bias on the showerhead (in volts). However, the y-axis is also representative of the LF power applied (in Watts), and the flow rate of the silane precursor (in sccm). The method used is similar to that used in the example relating to FIGS. 10 and 11, except that the silane precursor is introduced into the chamber after the HF and LF powers have been applied (i.e. the plasma has been allowed to stabilise) for a period of 2 s. A stabilisation period of 2 s produces silicon-rich particles on an intermittent basis.

Referring to FIG. 12, the introduction of the silane precursor is accompanied by a negative shift in the DC bias (between dashed lines 64 and 66). In this example, no silicon-rich particles were formed.

Turning to FIG. 13, the introduction of the silane precursor was accompanied by a positive (i.e. less negative) spike 136 in the DC bias. The positive spike 136 in the DC bias corresponds to the formation of silicon-rich particles. Further silicon-rich particles were not formed after the plasma re-stabilised after the addition of the silane precursor.

Without wishing to be bound by any theory or conjecture, it is believed that the silicon-rich particles tend to form when the silane precursor is introduced before the plasma has fully stabilised. The plasma takes approximately 2 s to fully establish and stabilise after initial plasma generation. The stabilisation period is dependent upon the processing parameters. In some instances, a partial plasma stabilisation may be sufficient to suppress the formation of the silicon-rich particles. It is preferable to introduce the silane precursor after the plasma that is being sustained has fully stabilised. Preferably the stabilisation period is at least 2 s, or more preferably at least 3 s.

What is claimed is:

1. A method of depositing silicon nitride by plasma-enhanced chemical vapour deposition (PECVD), the method comprising the steps of:
   providing a PECVD apparatus comprising a chamber and a substrate support disposed within the chamber;
   positioning a substrate on the substrate support;
   introducing a nitrogen gas ($N_2$) precursor into the chamber;
   applying a high frequency (HF) RF power and a low frequency (LF) RF power to sustain a plasma in the chamber;
   introducing a silane precursor into the chamber while the HF and LF RF powers are being applied so that the silane precursor forms part of the plasma being sustained; and
   subsequently removing the LF RF power or reducing the LF RF power by at least 90% while continuing to sustain the plasma so that silicon nitride is deposited onto the substrate by PECVD.

2. The method according to claim 1 in which the HF and LF RF powers are applied for a period immediately prior to the introduction of the silane precursor, wherein the period is sufficient to stabilise the plasma being sustained.

3. The method according to claim 2 in which the period is at least 2 s.

4. The method according to claim 1 in which the LF RF power is applied for a period of less than about 15 s immediately prior to the step of introducing the silane precursor into the chamber.

5. The method according to claim 1 in which the LF RF power is removed within about 10 s from introducing the silane precursor into the chamber.

6. The method according to claim 1 in which the HF RF power is applied to a gas inlet of the PECVD apparatus.

7. The method according to claim 6 in which the gas inlet is a showerhead.

8. The method according to claim 6 in which the LF RF power is applied to the gas inlet or the substrate support of the PECVD apparatus.

9. The method according to claim 1 in which the frequency of the HF RF power is more than 2 MHz.

10. The method according to claim 1 in which the frequency of the LF RF power is 300-500 kHz.

11. The method according to claim 1 in which the HF RF power has a power of 500-1200 W.

12. The method according to claim 1 in which the LF RF power has a power of 100-300 W during the step of applying the HF RF power and the LF RF power to sustain the plasma in the chamber.

13. The method according to claim 1 in which the silane precursor is $SiH_4$.

14. The method according to claim 1 further comprising the step of introducing a hydrogen gas ($H_2$) precursor into the chamber.

15. The method according to claim 1 performed at a temperature of less than 250° C.

16. The method according to claim 1 further comprising the steps of: introducing an inert gas into the chamber; and generating a plasma prior to the introduction of the nitrogen gas ($N_2$) precursor, wherein the inert gas is argon or helium.

* * * * *